United States Patent
Oyama et al.

(10) Patent No.: US 10,459,217 B2
(45) Date of Patent: Oct. 29, 2019

(54) OPTICAL SCANNING APPARATUS HAVING PIVOTING REFLECTOR AND PIEZOELECTRIC ELEMENT

(71) Applicant: DENSO CORPORATION, Kariya, Aichi-pref. (JP)

(72) Inventors: Koichi Oyama, Kariya (JP); Hideaki Nishikawa, Kariya (JP); Yusuke Kawai, Kariya (JP); Kenichi Sakai, Kariya (JP)

(73) Assignee: DENSO CORPORATION, Kariya (JP)

( * ) Notice: Subject to any disclaimer, the term of this patent is extended or adjusted under 35 U.S.C. 154(b) by 217 days.

(21) Appl. No.: 15/547,218

(22) PCT Filed: Mar. 25, 2016

(86) PCT No.: PCT/JP2016/001755
§ 371 (c)(1),
(2) Date: Jul. 28, 2017

(87) PCT Pub. No.: WO2016/166942
PCT Pub. Date: Oct. 20, 2016

(65) Prior Publication Data
US 2018/0039074 A1     Feb. 8, 2018

(30) Foreign Application Priority Data

Apr. 15, 2015  (JP) .................................. 2015-83576

(51) Int. Cl.
*G02B 5/08*       (2006.01)
*G02B 7/182*      (2006.01)
(Continued)

(52) U.S. Cl.
CPC .............. *G02B 26/10* (2013.01); *B81B 3/007* (2013.01); *G02B 5/08* (2013.01); *G02B 7/1821* (2013.01);
(Continued)

(58) Field of Classification Search
CPC .. B81B 3/0067–0078; B81B 2201/032; B81B 2201/04–042; B81B 2203/0109;
(Continued)

(56) References Cited

U.S. PATENT DOCUMENTS

| | | | |
|---|---|---|---|
| 2005/0179976 A1* | 8/2005 | Davis | G02B 26/0833 359/224.1 |
| 2012/0062970 A1* | 3/2012 | Yamada | G02B 7/1821 359/199.4 |

(Continued)

FOREIGN PATENT DOCUMENTS

| | | |
|---|---|---|
| JP | H09-097305 A | 4/1997 |
| JP | 2010-148265 A | 7/2010 |

*Primary Examiner* — Kimberly N. Kakalec
*Assistant Examiner* — Ryan S Dunning
(74) *Attorney, Agent, or Firm* — Posz Law Group, PLC (57) ABSTRACT

A reflector has a reflective surface on first and second directions. Each of torsion beams extends to each opposite side of the reflective surface in the first direction. Each of coupling portions is to each opposite side of the reflector in the first direction and includes a central portion with U-shape having two projection portions and a bottom portion joined to the torsion beam. The projection portions include first concave portions opposing across the torsion beam by being penetrated in thickness direction. Each first concave portion extends in the second direction from an opening to a side surface facing the torsion beam towards an opposite side surface up to a bottom. A distance between the bottoms of the first concave portions across the torsion beam is greater than a distance between the side surfaces each facing the torsion beam of the projection portions.

4 Claims, 6 Drawing Sheets

(51) Int. Cl.
  *G02B 26/08* (2006.01)
  *G02B 26/10* (2006.01)
  *H01L 41/047* (2006.01)
  *B81B 3/00* (2006.01)
  *H01L 41/09* (2006.01)
  *H02N 2/10* (2006.01)

(52) U.S. Cl.
  CPC ...... *G02B 26/0858* (2013.01); *H01L 41/0471* (2013.01); *H01L 41/0946* (2013.01); *H02N 2/10* (2013.01); *B81B 2201/042* (2013.01); *B81B 2203/0109* (2013.01); *B81B 2203/019* (2013.01); *B81B 2203/0154* (2013.01); *G02B 26/105* (2013.01); *H01L 41/0477* (2013.01)

(58) Field of Classification Search
  CPC ....... B81B 2203/0145–0181; B81B 2203/019; G02B 5/08; G02B 7/1821; G02B 26/0833–0866; G02B 26/105; H01L 41/0471; H01L 41/0477; H01L 41/053; H01L 41/094; H01L 41/0946; H02N 2/10; H02N 2/12
  USPC ............................................ 359/196.1–226.3
  See application file for complete search history.

(56) References Cited

U.S. PATENT DOCUMENTS

2012/0250124 A1  10/2012  Choi et al.
2014/0016170 A1  1/2014  Yamada et al.

\* cited by examiner

I # OPTICAL SCANNING APPARATUS HAVING PIVOTING REFLECTOR AND PIEZOELECTRIC ELEMENT

CROSS REFERENCE TO RELATED APPLICATIONS

The present application is a U.S. national stage of International Patent Application No. PCT/JP2016/001755 filed on Mar. 25, 2016 and is based on Japanese Patent Application No. 2015-83576 filed on Apr. 15, 2015, the disclosures of which are incorporated herein by reference.

TECHNICAL FIELD

The present disclosure relates to a piezoelectric-driven optical scanning apparatus.

BACKGROUND ART

An optical scanning apparatus that enables light beam scanning using a reflector has been conventionally proposed. The reflector is coupled to an actuator via a torsion beam. Voltage is applied to a piezoelectric film of the actuator to rotate the reflector by a natural resonance based on a natural resonant frequency of the torsion beam.

Such an optical scanning apparatus needs to distribute stresses produced during a drive to inhibit structure destruction. An optical scanning apparatus in Patent Literature 1 includes, to distribute stresses, a coupling portion that couples a supporting beam used as a rotation axis of a mirror to a movable frame having a driving source.

PRIOR ART LITERATURES

Patent Literature

Patent Literature 1: JP 2010-288435 A

SUMMARY OF INVENTION

However, the supporting beam of the optical scanning apparatus in Patent Literature 1 is twisted greatly relative to the coupling portion because the coupling portion does not fully bend when the mirror is tilted greatly. Great stresses thus generate on the upper and side surfaces of the supporting beam.

Small roughness generated in processing the structure exists on the opposing side surfaces to the mirror and movable frame in the surfaces of the joining portion between the supporting beam and coupling portion. Patterning of the supporting beam and coupling portion are made using a Bosch process. The Bosch process forms multiple irregularities on the etched side surfaces (side walls). Thus, even a small stress causes a crack and then destroys the structure. This causes an issue that a large scanning angle cannot be acquired.

The present disclosure has an object to provide an optical scanning apparatus that can inhibit destruction of a torsion beam.

To achieve the above object, according to an example of the present disclosure, an optical scanning apparatus is provided to include a reflector, torsion beams between which the reflector is centered, coupling portions, and supporting portions. The reflector includes a reflective surface reflecting a light beam, the reflective surface perpendicular to a thickness direction, the reflective surface having a first direction and a second direction perpendicular to the first direction. The torsion beams extend from the reflector to opposite sides of the reflector in the first direction, respectively, the torsion beams enabling the reflector to pivot about an axis parallel to the first direction. The coupling portions are disposed at opposite sides in the first direction, the coupling portions opposing each other across the reflector. Each of the coupling portions includes a central portion and opposite end portions. The central portion has a U-shape including a bottom portion and two projection portions. When viewing the reflective surface from above in the thickness direction, the central portion opens toward the reflector, the bottom portion of the U-shape being joined to an end of the torsion beam, the end of the torsion beam being opposite to an end of the torsion beam joined to the reflector. The two projection portions of the U-shape oppose each other to sandwich the torsion beam. The opposite end portions respectively extend in the second direction outwardly from opposite ends of the central portion in the second direction. The supporting portions are disposed at opposite sides in the second direction, the supporting portions opposing each other across the reflector, each of the supporting portions extending between opposite ends in the first direction, each of the supporting portions being joined to each of opposite ends of the coupling portion in the second direction. The central portion of the coupling portion is provided with first concave portions opposing each other in the projection portions of the U-shape, each projection portion having a side surface facing the torsion beam and an opposite side surface opposite to the side surface facing the torsion beam in the second direction. Each first concave portion has a concaved shape being concaved by penetrating the coupling portion in the thickness direction perpendicular to the reflective surface. Each first concave portion has an opening to the side surface facing the torsion beam and extending from the opening towards the opposite side surface in the second direction up to a bottom, when viewing the reflective surface from above in the thickness direction. Herein, a distance in the second direction between, of the concaved shapes of the first concave portions in the coupling portion, the bottoms opposing each other across the torsion beam is set greater than a distance in the second direction between, of the two projection portions of the U-shape, the side surfaces facing the torsion beam opposing each other across the torsion beam.

This forms a first concave portion to a coupling portion, which has a shape easily permitting bending deflection. The stresses on the side surface of the torsion beam can be thus reduced to inhibit destruction of the torsion beam when the reflector is tilted.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Hereafter, embodiments of the present disclosure are described based on the figures. The same or even portions between each following embodiment are given the same numeral symbols in the following explanation.

First Embodiment

Figure 1:
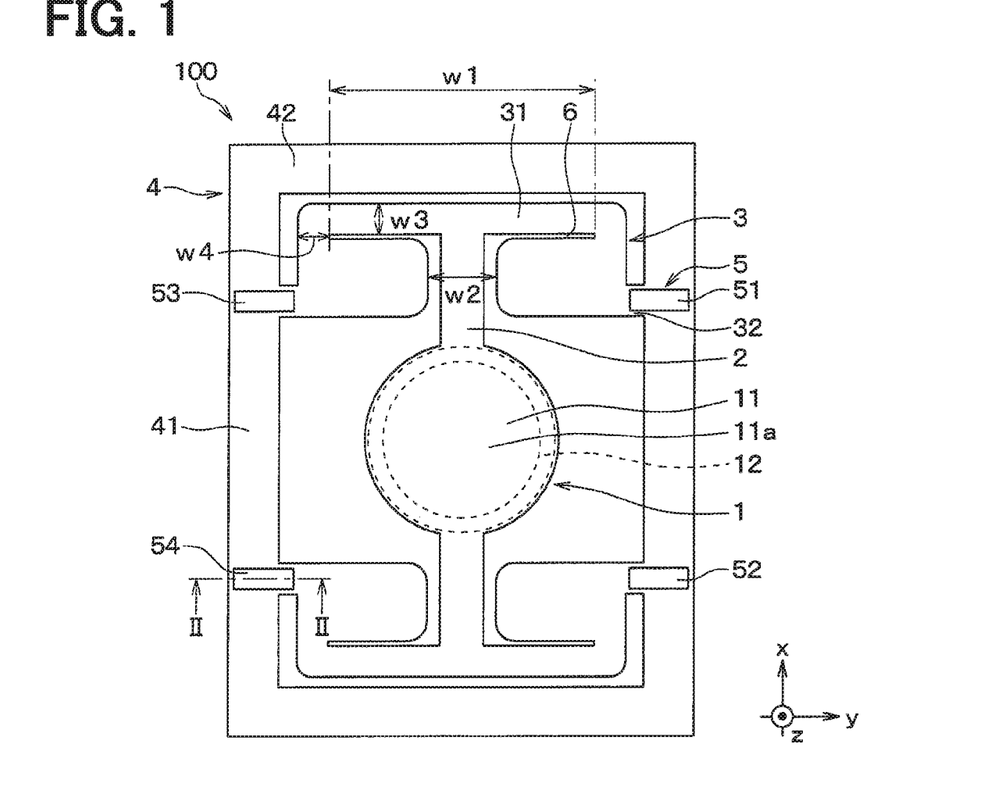
FIG. 1 is a top view of an optical scanning apparatus in a first embodiment.
Figure 2:
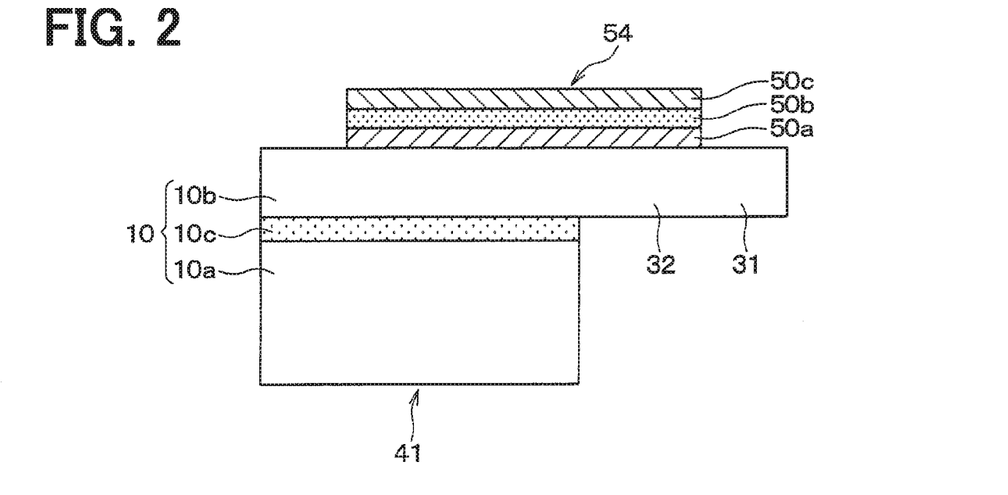
FIG. 2 is a sectional view of line II-II of FIG. 1.

A first embodiment of the present disclosure is described using FIG. 1 and FIG. 2. An optical scanning apparatus 100 of the present embodiment is used for head-up displays of automobiles, and may be used for other applications.

The optical scanning apparatus 100 includes a reflector 1, torsion beams 2, a coupling portions 3, a supporting frame 4, and an actuator 5. FIG. 1 illustrates only the above components. These components are supported by an unshown forced scanning portion or just an unshown substrate to form the optical scanning apparatus 100.

The above components of the optical scanning apparatus 100 are formed using a planar substrate 10. The substrate 10 of the present embodiment includes an SOI (Silicon On Insulator) substrate in which a buried oxide film 10c, which is a sacrificial layer, is sandwiched by a support substrate 10a and an active layer 10b. The active layer 10b is patterned to the above components of the optical scanning apparatus 100 as in FIG. 1.

The reflector 1 reflects the light beams emitted to the optical scanning apparatus 100, and includes a mirror 11 and a rib 12. The mirror 11 is formed by patterning the active layer 10b on the reflector 1, and has a circular upper surface. A reflective surface 11a of the reflector 1, the upper surface of the mirror 11, reflects light beams.

One direction on the plane of the reflective surface 11a is an x direction. A direction perpendicular to the x direction on the plane of the reflective surface 11a is a y direction. A direction perpendicular to the reflective surface 11a is a z direction. The x direction is also called one direction (or the first direction). The y direction is also called the other direction (or the second direction). The z direction is also called a thickness direction (or the third direction).

The rib 12 is formed to the back of the mirror 11. The rib 12 reinforces the mirror 11 to inhibit the mirror 11 from deforming by vibration during the drive of the optical scanning apparatus 100. The rib 12 in the reflector 1 is formed by partially removing the support substrate 10a and buried oxide film 10c, and has a hollow cylindrical shape in the present embodiment.

The reflector 1 is supported in a clamp-clamp manner by the torsion beams 2 extending to respective opposite sides in the x direction across the reflector 1. The torsion beams 2 enable the reflector 1 to pivot about the axis parallel to the x direction. The thickness of the torsion beam 2 in the z direction is equal to that of the active layer 10b in the reflector 1.

The torsion beam 2 has an end joined to the reflector 1 and an opposite end joined to the coupling portion 3. The coupling portion 3 couples the torsion beam 2 to the supporting frame 4 and actuator 5, and has a central portion 31 and opposite end portions 32. Each of the two central portions 31 is disposed to each opposite side in the x direction across the reflector 1. The central portion 31 has a U-shape that opens toward the reflector 1 when the reflective surface 11a is seen from above in the z direction (in the plane view (xy plane)). The opposite end portions 32 respectively extend from the opposite ends of the central portion 31 in the y direction outwardly in the y direction. As above, the coupling portion 3 is joined to the opposite end of the torsion beam 2 to the reflector 1. The central portion 31 extends in the y direction around the joining portion with the torsion beam 2. The central portion 31 is disposed perpendicularly to the torsion beam 2 around the joining portion with the torsion beam 2 in the xy plane. That is, the central portion 31 includes: (i) a bottom portion of the U-shape extending in the y direction about the joining portion with the torsion beam 2; and (ii) two projection portions respectively projecting from the y-directed opposite sides of the bottom portion of the U-shape toward the reflector 1. The two projection portions sandwich the torsion beam 2. The thickness of the coupling portion 3 in the z direction is equal to that of the torsion beam 2. The surface in the z direction is called a side surface. Therefore, the thickness is also a length of the side surface in the z direction.

The U-shaped central portion 31 includes as side surfaces: a y-z side surface of the bottom portion opposite the reflector 1 in the x direction; x-z side surfaces of the bottom portion and of the projection portions toward the opposite ends in the y direction; a y-z side surface of the bottom portion joined with the torsion beam 2 toward the reflector 1 in the x direction; y-z side surfaces of the projection portions toward the reflector 1 in the x direction; and x-z side surfaces of the projection portions toward the torsion beam 2.

A straight first slit 6 opens to each side surface facing the torsion beam 2 of the projection portions of the U-shape, penetrates the coupling portion 3 in the z direction, and extends in the y direction; the first slit 6 is formed toward each side of the torsion beam 2.

The first slit 6 is also called a first concave portion having a concaved shape. In the plane view (when the reflective surface 11a is seen from above), the first slit 6 has an opening to the side surface facing the torsion beam 2 and extends from the opening towards an opposite side surface that is located oppositely to the torsion beam 2 in the y direction, and the dead end of the first slit 6 is farthest from the torsion beam 2 in the y direction to form a bottom of the concaved shape.

Thus, a distance w1 between the opposing bottoms of the concaved shapes of the first slits 6 across the torsion beam 2 is greater than a distance w2 between the opposing side surfaces (facing the torsion beam 2) of the central portion 31 (namely, the projection portions of the U-shape) toward the torsion beam 2 in the y direction.

The above side surfaces of the coupling portion 3 are formed by removing the active layer 10b in the z direction. The first slit 6 herein opens at the farthest portion from the reflector 1 in the x direction in the side surfaces of the central portion 31 toward the torsion beam 2 and is formed to each opposite side in the y direction. The concave portion can be also called a gap portion or a notch portion.

When the reflector 1 is tilted, the coupling portion 3 bends with torsion of the torsion beam 2. The stress applied to the side surfaces of the torsion beam 2 is then distributed to the upper surface of the coupling portion 3. Not that the surface formed by removing the active layer 10b in the z direction in the surfaces of the torsion beam 2 is the side surfaces of the torsion beam 2.

The first slit 6 is formed to make a width w3 and a width w4 equal to each other. Here, the width w3 is an x-directed width of the farther portion of the central portion 31 from the reflector 1 than the first slit 6 in the x direction. The width w4 is a y-directed width of the farther portion of the central portion 31 from the torsion beam 2 than the first slit 6 in the y direction.

Four ends of the opposite end portions 32 across the central portions 31 are coupled to each other by the supporting frame 4. The supporting frame 4 supports the reflector 1 through the torsion beams 2 and coupling portions 3, and has a rectangular shape that contains the reflector 1, torsion beams 2, and coupling portions 3. The supporting frame 4 includes a first supporting portion 41 and a second supporting portion 42.

The first supporting portion 41 is a frame body forming the supporting frame 4 and extending in the x direction, and disposed to each opposite side in the y direction and extends in opposite sides in the x direction about the reflector 1. The first supporting portions 41 couple the opposite ends of the coupling portion 3 to each other. Specifically, the first supporting portions 41 couple y-directed two ends of the coupling portion 3 on one side of the reflector 1 to each other, and couple y-directed two ends of the coupling portion 3 on the other side of the reflector 1 to each other. The first supporting portion 41 is also called just a supporting portion.

The second supporting portion 42 is a frame body forming the supporting frame 4 and extending in the y direction. The opposite ends of each first supporting portion 41 are coupled by the second supporting portions 42. The supporting frame 4 is greater in thickness in the z direction than the torsion beam 2 and than the coupling portion 3, and is equal to the SOI substrate in thickness.

The actuator 5 is formed from each opposite end portion 32 of the coupling portion 3 to the supporting frame 4. The actuator 5 makes the torsion beam 2 resonate to make the reflector 1 pivot about an axis of the torsion beam 2, and includes a piezoelectric element formed to the upper surface ranging from each opposite end portion 32 of the coupling portion 3 to the supporting frame 4.

As in FIG. 2, the piezoelectric element includes a lower electrode 50a, a piezoelectric film 50b, and an upper electrode 50c, which are stacked in this order, and is formed from each opposite end portion 32 to the supporting frame 4 on the upper surface of the active layer 10b. The lower electrode 50a and upper electrode 50c include aluminum, gold, or platinum. The piezoelectric film 50b includes piezoelectric material such as lead zirconate titanate (PZT).

One piezoelectric element is formed to each of four joining portions, each joining portion being between each opposite end portion 32 and supporting frame 4. The four piezoelectric elements have each a rectangular upper surface. The four piezoelectric elements of the upper right, lower right, upper left, and lower left on plane of paper of FIG. 1 are piezoelectric elements 51, 52, 53, and 54, respectively.

The lower electrode 50a and upper electrode 50c of the piezoelectric element 51 are electrically coupled to the lower electrode 50a and upper electrode 50c of the piezoelectric element 52 by unshown wiring, respectively. The lower electrode 50a and upper electrode 50c of the piezoelectric element 53 are electrically coupled to the lower electrode 50a and upper electrode 50c of the piezoelectric element 54 by unshown wiring, respectively. Each piezoelectric element is electrically coupled to an unshown external controller by unshown wiring.

The optical scanning apparatus 100 of the present embodiment is configured as above. Such an optical scanning apparatus 100 can be produced by patterning the substrate 10 to form the upper surface shape and thickness of the reflector 1 and forming each piezoelectric element and each wiring on the surface of the active layer 10b by photo lithography and etching.

The optical canning apparatus 100 structured as above deforms the piezoelectric film 50b of each piezoelectric element to make the torsion beam 2 resonate and oscillate by applying resonant-scanning voltage to the electrodes of the piezoelectric elements of the actuator 5. This makes the reflector 1 pivot about the axis of the torsion beam 2. When the components of the reflector 1 of the optical scanning apparatus 100 are supported by the unshown forced scanning portion, the supporting frame 4 pivots about the axis parallel to the y direction by a piezoelectric element of the forced scanning portion. This makes the reflector 1 pivot about the axis parallel to the x direction and the axis parallel to the y direction to enable two-dimensional scanning.

When the coupling portion 3 does not fully deform at this time, the tilt of the reflector 1 by scanning is generated mainly by torsion of the torsion beam 2. Great stress is therefore applied to the torsion beam 2.

In contrast, the first slit 6 is formed to the coupling portion 3 in the present embodiment, and bending deformation easily occurs around the joining portion between the coupling portion 3 and torsion beam 2. That is, the tilt of the reflector 1 is generated by torsion of the torsion beam 2 and deformation of the coupling portion 3.

This reduces the stress on the torsion beam 2 as compared to when the coupling portion 3 does not fully deform. Specifically, S-shaped torsion about the axis of the torsion beam 2 occurs around the joining portion between the coupling portion 3 and the torsion beam 2 in response to rotation about the axis of the torsion beam 2, reducing torsion of the torsion beam 2 relative to the coupling portion 3. This reduces the stress on the torsion beam 2.

The bending stress on the coupling portion 3 deforms the upper surface of the coupling portion 3 around the joining portion between the torsion beam 2 and coupling portion 3. The upper surface is less irregular than the processed side surfaces and thus is less likely to be broken by deformation. Structural destruction is therefore less likely to occur even at a great scanning angle as compared to when the torsion beam 2 is twisted greatly relative to the coupling portion 3 to apply great stress to the processed side surfaces of the optical scanning apparatus of Patent Literature 1.

As above, the optical scanning apparatus 100 of the present embodiment has the first slits 6 formed to the coupling portion 3 to distribute stress to the upper surface of the coupling portion 3 and to thus reduce stress on the side surfaces of the torsion beam 2 when the optical scanning apparatus 100 operates. This can inhibit destruction of the torsion beam 2. Additionally, the optical scanning apparatus 100 can be used at a great scanning angle.

It is preferable that the corner between the side surfaces of the torsion beam 2 and coupling portion 3 be rounded at the joining portion between the torsion beam 2 and coupling portion 3 to reduce stress concentration on the joining portion.

Second Embodiment

A second embodiment of the present disclosure is described. The present embodiment describes the coupling portion 3 having a different shape from that of the coupling portion 3 of the first embodiment, and is the same as the first embodiment except for the coupling portion 3. Only the difference from the first embodiment is therefore explained.

Figure 3:
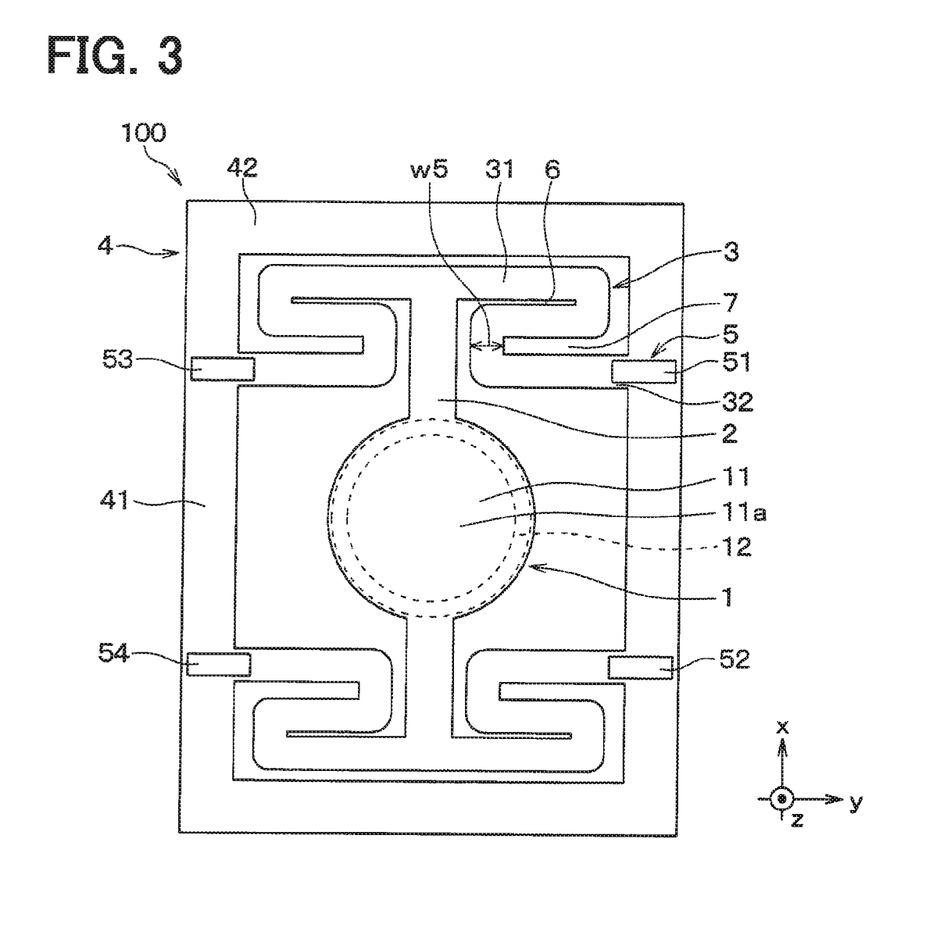
FIG. 3 is a top view of an optical scanning apparatus in a second embodiment.

A second sit 7 is formed to the coupling portion 3 in the present embodiment. As in FIG. 3, the second slit 7 is formed to the coupling portion 3 closer to the reflector 1 than the slit 6 in the x direction to open toward the side surface of the central portion 31 opposite the torsion beam 2. Then, the second slit 7 is formed straight to correspond to a second concave portion having a concaved shape to be concaved extending in the y direction by penetrating the coupling portion 3 in the z direction. The second slit 7 herein has an opening and a bottom as the dead end of the concaved shape. The opening opens from the nearest portion to the reflector 1 in the x direction in the opposite side surface of the central portion 31 to the torsion beam 2. The bottom is formed in the other side of the second slit 7 toward the torsion beam 2. The slits 7 are formed to respective opposite sides of the torsion beam 2 in the y direction.

The same effect as the first embodiment is obtained also in the present embodiment using such a structure. The second slit 7 is formed to the coupling portion 3 to fold the coupling portion 3 and to thus make the coupling portion 3 more deformable. This can further reduce stress on the side surface of the torsion beam 2 to further inhibit destruction of the torsion beam 2.

A width w5 is preferably greater than the width w3 and than the width w4 to make deformable the portion closer to the torsion beam 2 in the route from the torsion beam 2 to the supporting frame 4. The width w5 is a y-directed width in the y direction of the portion closer to the torsion beam 2 in the y direction than the second slit 7 in the portion of the central portion 31 surrounding the second slit 7.

Third Embodiment

A third embodiment of the present disclosure is described. The present embodiment describes the actuator 5 at different positions from those in the second embodiment. Except for those positions, the present embodiment is the same as the second embodiment. Only the difference from the second embodiment is therefore explained.

Figure 4:
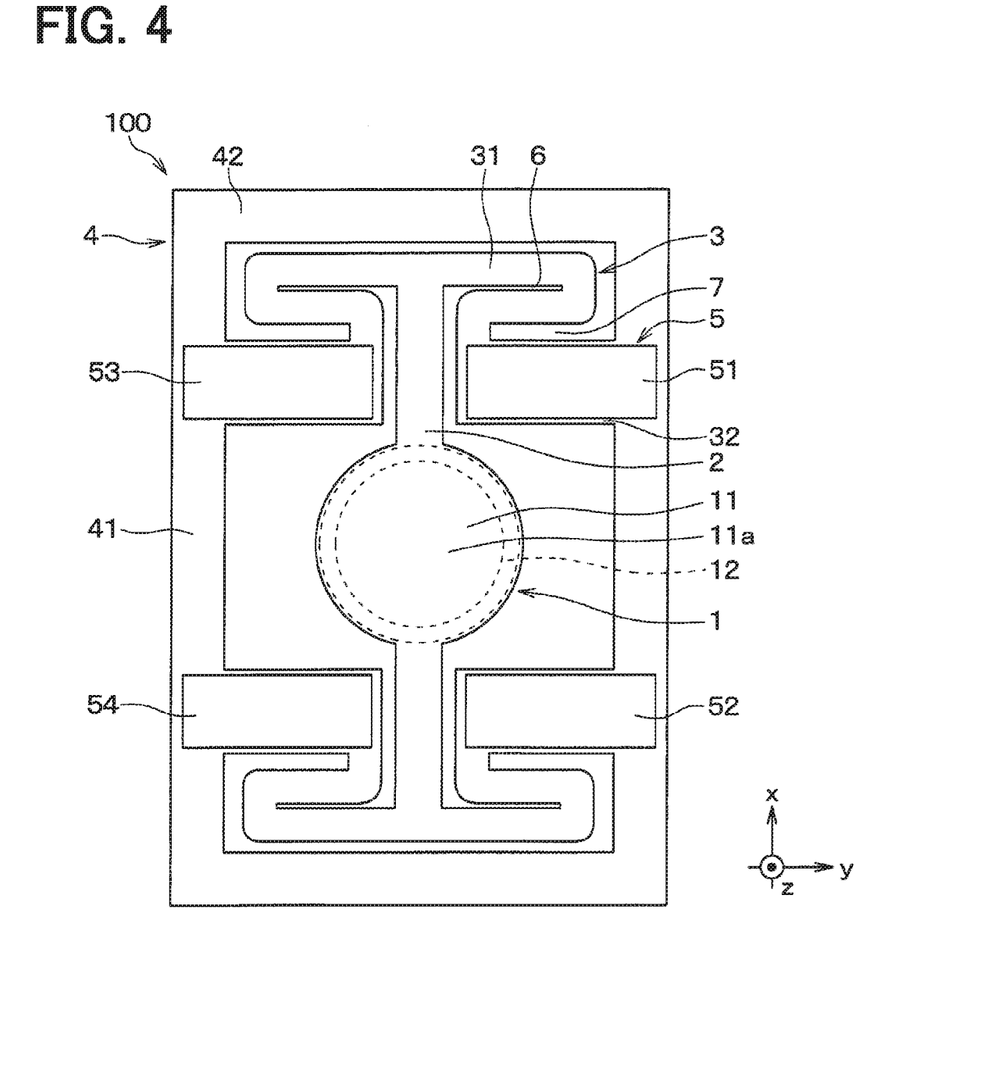
FIG. 4 is a top view of an optical scanning apparatus in a third embodiment.

As in FIG. 4 in the present embodiment, the actuator 5 is disposed from the central portion 31 of the coupling portion 3 to each opposite end portion 32 and the supporting frame 4. The actuator 5 has piezoelectric elements each having a rectangular upper surface. On the central portion 31, each piezoelectric element is formed closer to the reflector 1 than the second slit 7 in the x direction and extends towards a tip end adjacent to the torsion beam 2.

In the present embodiment, the width of the actuator 5 in the y direction can be great by forming the second slit 7 to fold the coupling portion 3 as in the second embodiment. Deformations of the portions of the actuator 5 on the central portion 31 and opposite end portion 32 can be thus great to make a scanning angle great. The same effect as the second embodiment is acquired also in the present embodiment.

Figure 5:
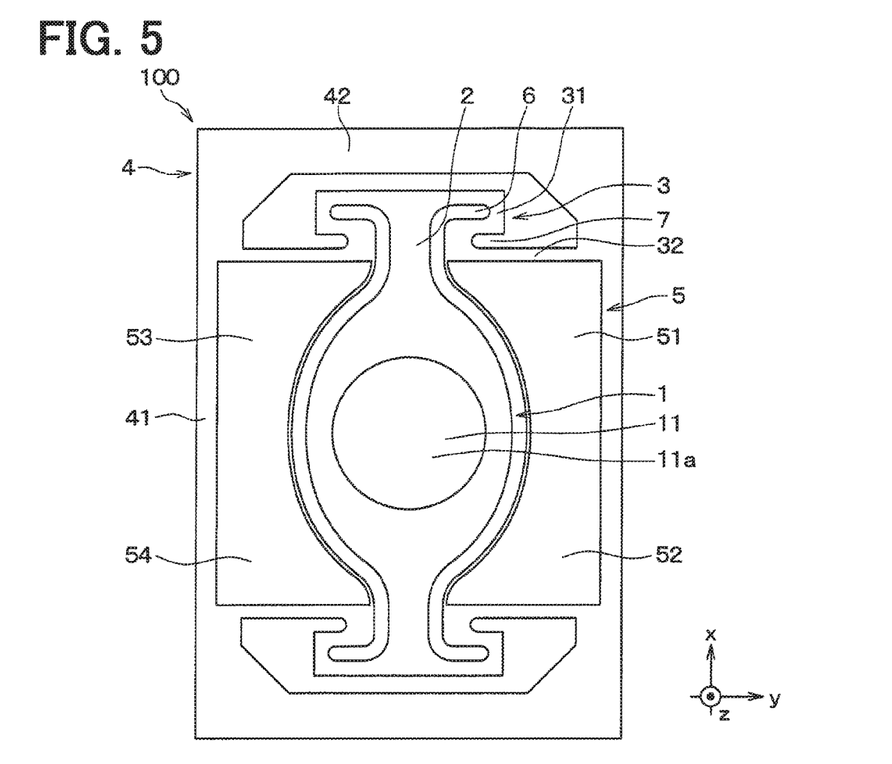
FIG. 5 is a top view of a model for analysis.

The inventors have analyzed operation of the optical scanning apparatus 100 using the model in FIG. 5. The model in FIG. 5 is a modification of the present embodiment, and indicates that the shapes of the coupling portion 3 and actuator 5 in the present embodiment are changed. Specifically, each portion of the actuator 5 on the coupling portions 3 extends along the edges of the reflector 1 and torsion beam 2 to integrate the piezoelectric elements 51 and 52 with each other and the piezoelectric elements 53 and 54 with each other.

The model in FIG. 5 indicates that the corner between the side surfaces of the reflector 1 and torsion beam 2 is rounded at the joining portion between the reflector 1 and torsion beam 2, and the corner between the side surfaces of the torsion beam 2 and coupling portion 3 is rounded at the joining portion between the torsion beam 2 and coupling portion 3. The surface formed by removing the active layer 10b on the surface of the reflector 1 in the z direction is defined as the side surface of the reflector 1.

Figure 6:
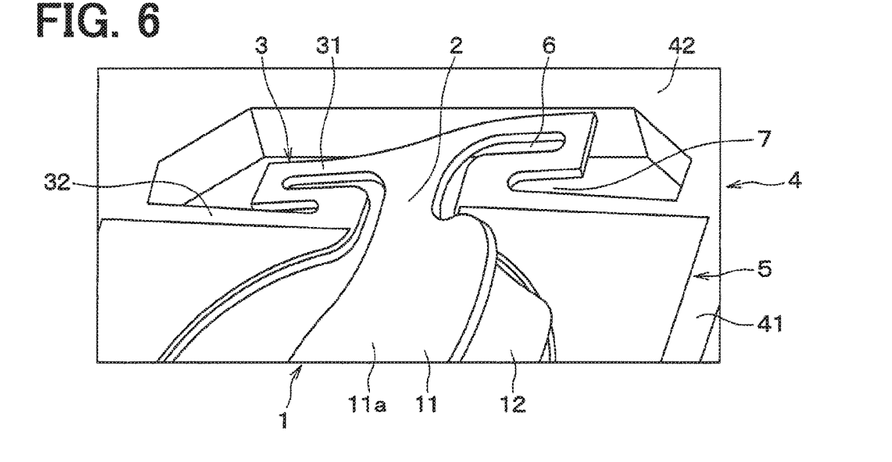
FIG. 6 is a diagram illustrating an analysis result using the model of FIG. 5.

FIG. 6 illustrates that the tilt of the reflector 1 causes S-shaped bending around the joining portion between the coupling portion 3 and torsion beam 2 about the axis of the torsion beam 2 to make small the torsion of the torsion beam 2 relative to the coupling portion 3.

Fourth Embodiment

A fourth embodiment of the present disclosure is described. The present embodiment describes the coupling portion 3 having a different shape from that in the third embodiment. Except for this shape, the present embodiment is the same as the third embodiment. Only the difference from the third embodiment is therefore explained.

Figure 7:
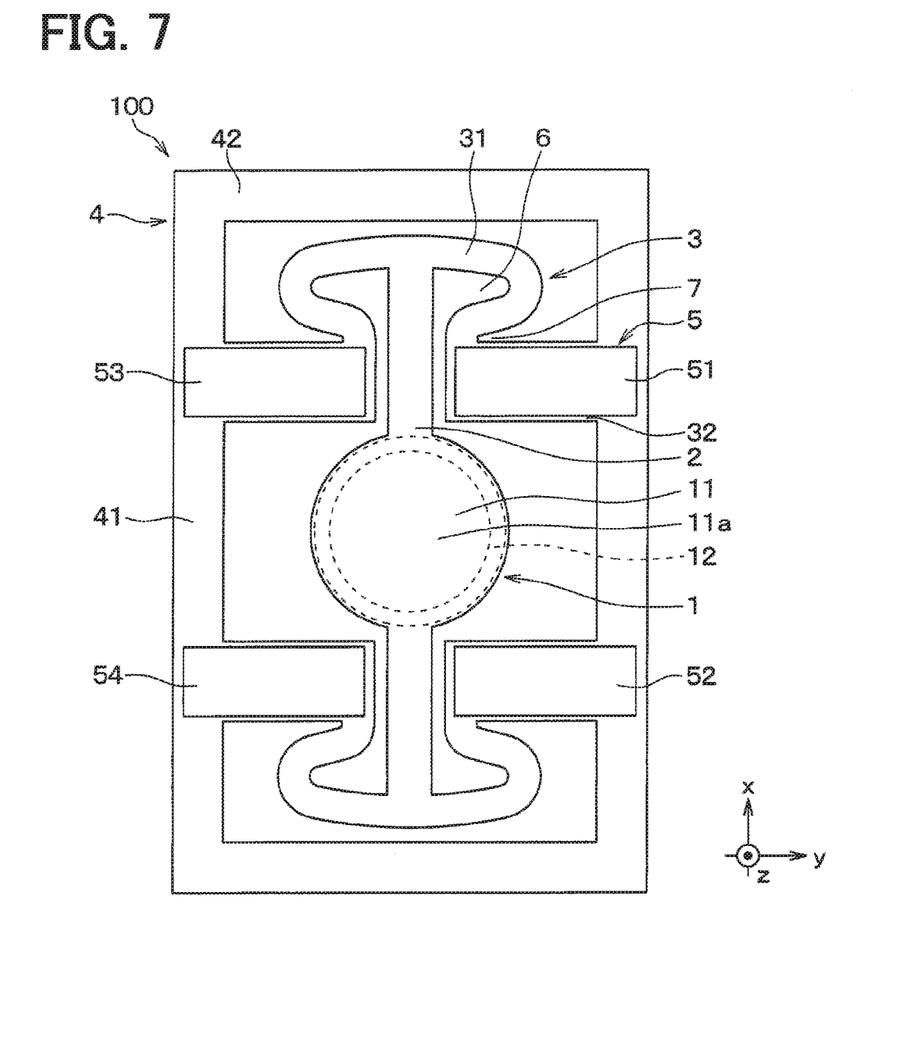
FIG. 7 is a top view of an optical scanning apparatus in a fourth embodiment.

As in FIG. 7 in the present embodiment, the central portion 31 of the coupling portion 3 is curved around the joining portion between the central portion 31 of the coupling portion 3 and the torsion beam 2, and the first slit 6 is made smaller in width in the x direction from the opening toward the bottom. The corner between the side surfaces of the portions surrounding the first slit 6 is rounded in the coupling portion 3, and the upper surface of the central portion 31 is folded in the arc shape around the first slit 6. In the present embodiment, the second slit 7 is made smaller in width in the x direction from the opening toward the bottom.

The present embodiment using such a structure also acquires the same effect as the third embodiment. In the present embodiment, the central portion 31 is folded in the arc shape to reduce the stresses concentrated on the folded corner of the central portion 31. This can inhibit destruction of the torsion beam 2 and destruction of the coupling portion 3.

Fifth Embodiment

A fifth embodiment of the present disclosure is described. The present embodiment describes the torsion beam 2 and coupling portion 3 having different shapes from those in the third embodiment. Except for these shapes, the present embodiment is the same as the third embodiment. Only differences from the third embodiment are therefore explained.

In the present embodiment, a third slit 8 is formed to the torsion beam 2 and coupling portion 3. As in FIG. 8, the third slit 8 opens toward the side surface of the central portion 31 opposite the reflector 1, penetrates the coupling portion 3 and torsion beam 2 in the z direction, and extends in the x direction. Thus, a torsion beam 2 is provided as two torsion beam units that are in parallel to the x direction and are disposed to respective opposite sides of the reflector 1. The third slit 8 is also called a third concave portion.

The present embodiment using such a structure can also obtain the same effect as the third embodiment. The third slit 8 is formed to divide the torsion beam 2 into two (the torsion beam 2 formed to have two parallel torsion beam units). The two torsion beam units 2 are formed to respective opposite sides of the reflector 1. The portion joined to the coupling portion 3 in the torsion beam 2 is thus deformable to apply not only torsion but also bending force to the torsion beam 2. That is, since torsion stress is reduced on the torsion beam 2 and bending stress becomes great, destruction of the torsion beam 2 can be inhibited similarly to the effect of bending deformation of the coupling portion 3 in the first embodiment.

Figure 8:
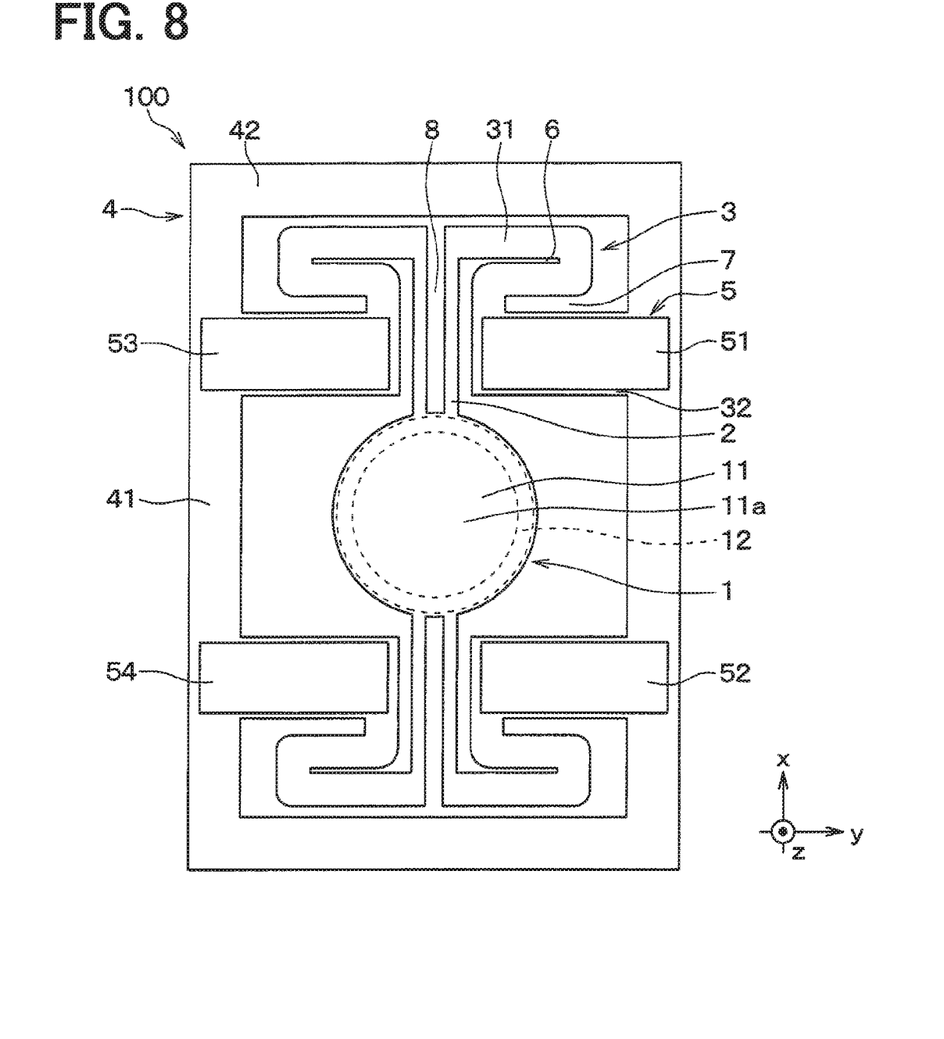
FIG. 8 is a top view of an optical scanning apparatus in a fifth embodiment.

FIG. 8 illustrates that the third slit 8 extends to the end of the torsion beam 2 toward the reflector 1. The third slit 8 may not extend to the end of the torsion beam 2 toward the reflector 1.

Another Embodiment

The present disclosure is not limited to the above embodiments, and can be adequately modified within the range of the claims.

The straight first slit 6 is described as the first concave portion in the first to third and fifth embodiments. The first concave portion may use a concave portion having a different shape concaved oppositely to the torsion beam 2. The straight second slit 7 is described as the second concave portion in second, third, and fifth embodiments. The second concave portion may use a concave portion having a different shape concaved toward the torsion beam 2.

The actuator 5 is formed to the portion ranging from the opposite end portions 32 of the coupling portion 3 to the supporting frame 4, but may be formed to a different position. The actuator 5 may be formed to only the opposite end portions 32.

The supporting frame 4 includes the second supporting portion 42 in the first embodiment. The supporting frame 4 may not include the second supporting portion 42.

The central portion 31 is folded once by the first slit 6 and second slit 7 in the second embodiment. A slit penetrating the central portion 31 in the z direction may be added to fold the central portion 31 twice or more.

The fourth embodiment describes the shape curved around the joining portion of the central portion 31 of the coupling portion 3 with the torsion beam 2. A straight shape may be formed around the joining portion with the torsion beam 2 to fold the upper surface of the central portion 31 in the arc shape around the bottom of the first slit 6.

Each above embodiment relates to each other, and can be combined adequately except that the combination is clearly difficult.

In the fifth embodiment, the central portion 31 may be folded in the arc shape as in the fourth embodiment.

While the present disclosure has been described with reference to embodiments thereof, it is to be understood that the disclosure is not limited to the embodiments and constructions. The present disclosure is intended to cover various modification and equivalent arrangements. In addition, the various combinations and configurations, other combinations and configurations, including more, less or only a single element, are also within the spirit and scope of the present disclosure.

The invention claimed is:
1. An optical scanning apparatus comprising:
a reflector that includes a reflective surface reflecting a light beam, the reflective surface perpendicular to a thickness direction, the reflective surface having a first direction and a second direction perpendicular to the first direction;
torsion beams between which the reflector is centered, the torsion beams extending from the reflector to opposite sides of the reflector in the first direction, respectively, the torsion beams enabling the reflector to pivot about an axis parallel to the first direction;
coupling portions disposed at opposite sides in the first direction, the coupling portions opposing each other across the reflector,
each of the coupling portions including
(i) a central portion having a U-shape including a bottom portion and two projection portions, the central portion opening toward the reflector when viewing the reflective surface from above in the thickness direction,
the bottom portion of the U-shape being joined to an end of the torsion beam, the end of the torsion beam being opposite to an end of the torsion beam joined to the reflector,
the two projection portions of the U-shape opposing each other to sandwich the torsion beam, and
(ii) opposite end portions that respectively extend in the second direction outwardly from opposite ends of the central portion in the second direction; and
supporting portions disposed at opposite sides in the second direction, the supporting portions opposing each other across the reflector,
each of the supporting portions extending between opposite ends in the first direction,
each of the supporting portions being joined to each of opposite ends of the coupling portion in the second direction,
wherein:
the central portion of the coupling portion is provided with first concave portions opposing each other in the projection portions of the U-shape, each projection portion having (i) a side surface facing the torsion beam and (ii) an opposite side surface opposite to the side surface facing the torsion beam in the second direction,
each first concave portion having a concaved shape being concaved by penetrating the coupling portion in the thickness direction perpendicular to the reflective surface,
each first concave portion having an opening to the side surface facing the torsion beam and extending from the opening towards the opposite side surface in the second direction up to a bottom, when viewing the reflective surface from above in the thickness direction;
a distance in the second direction between, of the concaved shapes of the first concave portions in the coupling portion, the bottoms opposing each other across the torsion beam is set greater than a distance in the second direction between, of the two projection portions of the U-shape, the side surfaces facing the torsion beam opposing each other across the torsion beam;
the central portion of the coupling portion is provided with a second concave portion in a portion closer to the reflector than the first concave portion in the first direction,
the second concave portion having a concaved shape being concaved by penetrating the coupling portion in the thickness direction perpendicular to the reflective surface,
the second concave portion
opening to the opposite side surface of each projection portion of the central portion and
extending towards the side surface facing the torsion beam;
a piezoelectric element configured by laminating a lower electrode, a piezoelectric film, and an upper electrode is formed to a surface of a portion ranging from each of the opposite end portions to the central portion, the portion being closer to the reflector than the second concave portion in the first direction; and the piezoelectric element is formed up to a tip end of the central portion, the tip end adjacent to the torsion beam.

2. The optical scanning apparatus according to claim 1, wherein the central portion is formed to be folded in an arc shape around the bottom of the concaved shape of the first concave portion.

3. The optical scanning apparatus according to claim 1, wherein:

a third concave portion having a concaved shape being concaved is provided by penetrating the coupling portion and the torsion beam in the thickness direction, the third concave portion opening to a side surface of the central portion, the side surface being formed in the thickness direction and oppositely to the reflector in the first direction, the third concave portion extending from the side surface of the central portion toward the reflector in the first direction; and the torsion beam is provided as two torsion beam units due to the third concave portion, the two torsion beam units being parallel to the first direction by opposing each other at opposite sides in the second direction and extending in the first direction.

4. The optical scanning apparatus according to claim 1, wherein the first concave portion is formed as opening to a portion farthest from the reflector in the first direction in the side surface facing the torsion beam of the central portion.

\* \* \* \* \*